US010229865B2

(12) United States Patent
Seol et al.

(10) Patent No.: US 10,229,865 B2
(45) Date of Patent: Mar. 12, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Yong Jin Seol, Suwon-si (KR); Chang Bae Lee, Suwon-si (KR); Min Seok Jang, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/471,205

(22) Filed: Mar. 28, 2017

(65) Prior Publication Data

US 2017/0373029 A1   Dec. 28, 2017

(30) Foreign Application Priority Data

Jun. 23, 2016   (KR) .................. 10-2016-0078487
Jul. 25, 2016   (KR) .................. 10-2016-0094307

(51) Int. Cl.
*H01L 23/00*   (2006.01)
*H01L 23/31*   (2006.01)
(Continued)

(52) U.S. Cl.
CPC ........ *H01L 23/481* (2013.01); *H01L 23/3107* (2013.01); *H01L 24/24* (2013.01);
(Continued)

(58) Field of Classification Search
CPC ............... H01L 23/3178; H01L 24/97; H01L 2225/1041; H01L 2225/107; H01L 2023/4087
See application file for complete search history.

(56) References Cited

U.S. PATENT DOCUMENTS 6,011,301 A *   1/2000   Chiu .................... H01L 21/563
                                                    257/678
6,506,633 B1 *  1/2003   Cheng ................ H01L 23/5389
                                                    257/E21.705
(Continued)

FOREIGN PATENT DOCUMENTS

CN   103168358 A   6/2013
JP   2012-039090 A  2/2012
(Continued)

OTHER PUBLICATIONS

Office Action issued in Taiwanese Patent Application No. 106110219, dated Apr. 30, 2018 (English abstract).
(Continued)

*Primary Examiner* — David A Zarneke
(74) *Attorney, Agent, or Firm* — Morgan Lewis & Bockius LLP

(57) ABSTRACT

A fan-out semiconductor package includes a first interconnection member having a through-hole; a semiconductor chip disposed in the through-hole of the first interconnection member and having an active surface having connection pads disposed thereon and an inactive surface opposite the active surface; an encapsulant encapsulating at least some portions of the first interconnection member and the semiconductor chip; and a second interconnection member disposed on the first interconnection member and the semiconductor chip. The first interconnection member and the second interconnection member respectively include a plurality of redistribution layers electrically connected to the connection pads of the semiconductor chip, and the semiconductor chip has a groove defined in the active surface and between a peripheral edge of the semiconductor chip and the connection pads of the semiconductor chip.

20 Claims, 12 Drawing Sheets

(51) Int. Cl.
*H01L 23/48* (2006.01)
*H01L 29/06* (2006.01)

(52) U.S. Cl.
CPC .......... *H01L 24/25* (2013.01); *H01L 29/0657* (2013.01); *H01L 24/05* (2013.01); *H01L 24/13* (2013.01); *H01L 2224/0233* (2013.01); *H01L 2224/0235* (2013.01); *H01L 2224/0239* (2013.01); *H01L 2224/02375* (2013.01); *H01L 2224/02379* (2013.01); *H01L 2224/02381* (2013.01); *H01L 2224/0401* (2013.01); *H01L 2224/04105* (2013.01); *H01L 2224/05559* (2013.01); *H01L 2224/05569* (2013.01); *H01L 2224/05572* (2013.01); *H01L 2224/06135* (2013.01); *H01L 2224/12105* (2013.01); *H01L 2224/13023* (2013.01); *H01L 2224/13024* (2013.01); *H01L 2224/16238* (2013.01); *H01L 2224/18* (2013.01); *H01L 2224/20* (2013.01); *H01L 2224/221* (2013.01); *H01L 2224/244* (2013.01); *H01L 2224/24155* (2013.01); *H01L 2224/25171* (2013.01); *H01L 2224/25175* (2013.01); *H01L 2924/10156* (2013.01); *H01L 2924/1431* (2013.01); *H01L 2924/1432* (2013.01); *H01L 2924/1434* (2013.01); *H01L 2924/15153* (2013.01)

(56) References Cited

U.S. PATENT DOCUMENTS

| | | | | |
|---|---|---|---|---|
| 6,701,898 | B2* | 3/2004 | Tokuo | F02D 41/38 123/456 |
| 7,064,452 | B2* | 6/2006 | Huang | H01L 23/16 257/778 |
| 7,122,893 | B2* | 10/2006 | Weng | H01L 21/563 257/730 |
| 7,635,914 | B2* | 12/2009 | Palaniappan | H01L 25/105 257/686 |
| 7,658,470 | B1* | 2/2010 | Jones | B41J 2/14072 347/50 |
| 7,880,301 | B2* | 2/2011 | Imori | H01L 21/563 257/739 |
| 7,906,859 | B2* | 3/2011 | Yoshioka | H01L 23/3107 257/788 |
| 8,093,711 | B2* | 1/2012 | Zudock | H01L 21/568 257/698 |
| 8,174,131 | B2* | 5/2012 | Zhang | H01L 21/563 257/669 |
| 8,263,435 | B2* | 9/2012 | Choi | H01L 21/561 257/E21.499 |
| 8,421,201 | B2* | 4/2013 | Lee | H01L 21/563 257/686 |
| 8,716,870 | B2* | 5/2014 | Gowda | H01L 23/3735 257/690 |
| 8,866,287 | B2* | 10/2014 | Teh | H01L 21/568 257/700 |
| 9,524,955 | B2* | 12/2016 | Huang | H01L 21/561 |
| 9,620,413 | B2* | 4/2017 | Strothmann | H01L 21/6836 |
| 9,847,317 | B2* | 12/2017 | Yu | H01L 25/0655 |
| 2002/0139969 | A1 | 10/2002 | Mimino et al. | |
| 2005/0093178 | A1* | 5/2005 | Huang | H01L 23/16 257/787 |
| 2007/0035008 | A1* | 2/2007 | Wu | H01L 23/3107 257/700 |
| 2008/0073780 | A1 | 3/2008 | Imori | |
| 2012/0013021 | A1 | 1/2012 | Kobayashi et al. | |
| 2016/0013153 | A1 | 1/2016 | Meyer | |
| 2016/0043047 | A1 | 2/2016 | Shim et al. | |

FOREIGN PATENT DOCUMENTS

| | | |
|---|---|---|
| KR | 2003-0018458 A | 3/2003 |
| KR | 10-2008-0027166 A | 3/2008 |
| KR | 10-2013-0132162 A | 12/2013 |
| KR | 10-2016-0024379 A | 3/2016 |
| TW | 201606975 A | 2/2016 |
| TW | 201618196 A | 5/2016 |
| WO | 2012012338 A1 | 1/2012 |
| WO | 2015026344 A | 2/2015 |

OTHER PUBLICATIONS

Office Action issued in Korean Patent Application No. 10-2016-0094307, dated Aug. 28, 2018 (English translation).

* cited by examiner

I-I'

I-I'

FAN-OUT SEMICONDUCTOR PACKAGE

CROSS-REFERENCE TO RELATED APPLICATIONS

This application claims benefit of priority to Korean Patent Application Nos. 10-2016-0078487 filed on Jun. 23, 2016, and 10-2016-0094307 filed on Jul. 25, 2016, in the Korean Intellectual Property Office, the disclosures of which are incorporated herein by reference in its entirety.

BACKGROUND

1. Field

The present disclosure relates to a semiconductor package, and more particularly, to a fan-out semiconductor package in which connection terminals may extend outwardly of a region in which a semiconductor chip is disposed.

2. Description of Related Art

A recent trend in the development of technology related to semiconductor chips has been to reduce the size of semiconductor chips. Therefore, in the case of package technology, in accordance with a rapid increase in demand for small-sized semiconductor chips, the implementation of a semiconductor package having a compact size while including a plurality of pins is desired.

One type of package technology suggested to satisfy the technical demand described above is a fan-out package. Such a fan-out package has a compact size and may allow a plurality of pins to be implemented by redistributing connection terminals outwardly from a region in which a semiconductor chip is disposed.

However, in a process of manufacturing the fan-out package, an encapsulant encapsulating the semiconductor chip bleeds or flows into connection pads, or other portions of the package.

SUMMARY

An aspect of the present disclosure may provide a fan-out semiconductor package that may prevent or otherwise minimize bleeding or flow of an encapsulant and thereby improve a reliability of vias.

According to an aspect of the present disclosure, a fan-out semiconductor package may be provided, in which bleeding or flow of an encapsulant may be minimized by forming a groove in an active surface of a semiconductor chip on which connection pads are disposed.

According to an aspect of the present disclosure, a fan-out semiconductor package may include: a first interconnection member having a through-hole; a semiconductor chip disposed in the through-hole of the first interconnection member and having an active surface including connection pads disposed thereon and an inactive surface opposite the active surface; an encapsulant encapsulating at least some portions of the first interconnection member and the semiconductor chip; and a second interconnection member disposed on the first interconnection member and the semiconductor chip, wherein the first interconnection member and the second interconnection member respectively include a plurality of redistribution layers electrically connected to the connection pads of the semiconductor chip, and the semiconductor chip has a groove defined in the active surface and between a peripheral edge of the semiconductor chip and the connection pads of the semiconductor chip.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or omitted for clarity.

The term "an exemplary embodiment" used herein does not refer to the same exemplary embodiment, and is provided to emphasize a particular feature or characteristic different from that of another exemplary embodiment. However, exemplary embodiments provided herein may be combined in whole or in part with other disclosed exemplary embodiments. For example, an element described in an exemplary embodiment, may be included in another exemplary embodiment even if not explicitly described therein, unless an opposite or contradictory description is provided.

As used herein, a "connection" of a first component with a second component, and any variations thereof, include an indirect connection between first and second components through one or more other components as well as a direct connection between first and second components. As used herein, "electrically connected" and any variations thereof refer to a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the disclosure. Similarly, a second element may also be referred to as a first element.

Herein, an upper portion, a lower portion, an upper side, a lower side, an upper surface, a lower surface, and the like, are with reference to illustrative embodiments depicted in FIGS. 1-15.

Terms used herein are used only in order to describe an exemplary embodiment rather than limiting the present disclosure. In this case, singular forms include plural forms unless interpreted otherwise in context.

Electronic Device

Figure 1:
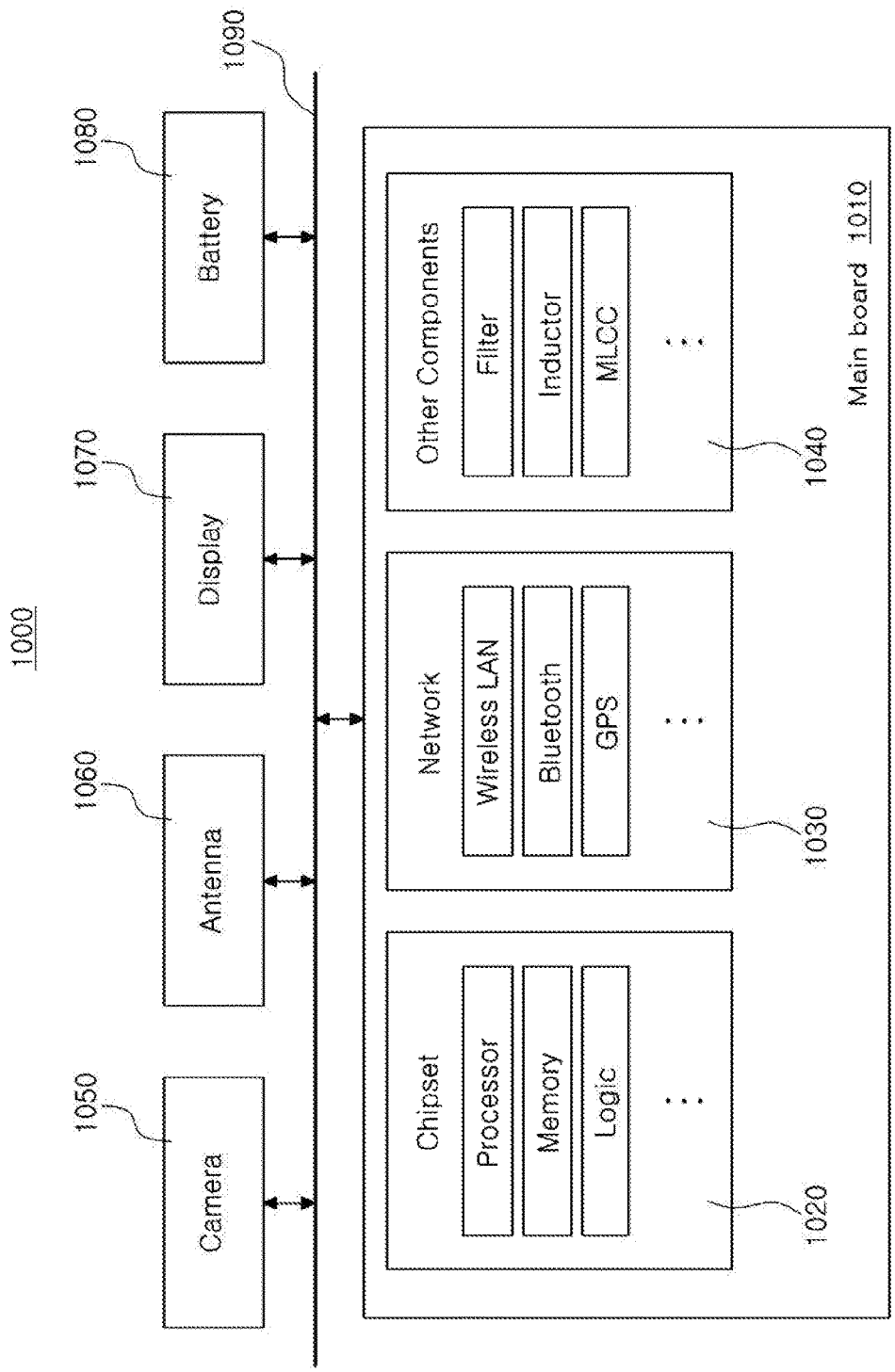
FIG. 1 is a schematic block diagram illustrating an example of an electronic device system.

FIG. 1 is a block diagram illustrating an example electronic device system.

Referring to FIG. 1, an electronic device 1000 may include a main board (or mother board) 1010 having chip-related components 1020, network-related components 1030, electrical components 1040, and the like, connected thereto. In an example and as illustrated, the chip-related components 1020, the network-related components 1030, and the electrical components 1040 may be considered as "on-board" components that are installed on the main board 1010, as opposed to other electrical components that may be external to the main board 1010 and electrically connected thereto via signal lines 1090. The chip-related components 1020, the network-related components 1030, and the electrical components 1040 may be connected to each other and to the other external components of the main board 1010 via signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), a combination thereof, and the like. However, the chip-related components 1020 are not limited thereto, and may also include other types of chip-related components, without departing from the scope of the disclosure. In addition, although illustrated as discreet components, two or more chip-related components 1020 may be combined with each other.

The network-related components 1030 may include one or more electronic components for implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, other wireless and wired protocols designated after the abovementioned protocols, a combination thereof, and the like. However, the network-related components 1030 are not limited thereto, and may also include a variety of other wireless or wired standards or protocols, without departing from the scope of the disclosure. In addition, although illustrated as discreet components, the network-related components 1030 may be combined with each other, and may further be combined with the chip-related components 1020.

Electrical components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), a combination thereof and the like. However, the electrical components 1040 are not limited thereto, and may also include passive components used for various other purposes, or the like. In addition, two or more electrical components 1040 may be combined with each other, or one or more electrical components 1040 may be combined with the chip-related components 1020 and/or the network-related components 1030.

Depending on a type of the electronic device 1000, and as discussed above, the electronic device 1000 may include electrical components that may be external to the main board 1010. These electrical components may include, for example, a camera module 1050, an antenna 1060, a display device 1070, and a battery 1080. Although not illustrated, other external electrical components may be or include an audio codec, a video codec, a power amplifier, a compass, an accelerometer, a gyroscope, a speaker, a mass storage unit (for example, a hard disk drive), a compact disk (CD) drive, a digital versatile disk (DVD) drive, a combination thereof and the like. It will be understood that the components in the electronic device 1000 are not limited thereto, and electronic component 1000 may include other components depending on the application and user requirement.

In an example, the electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, a combination thereof, and the like. However, the electronic device 1000 is not limited thereto, and may be or include other electronic devices.

Figure 2:
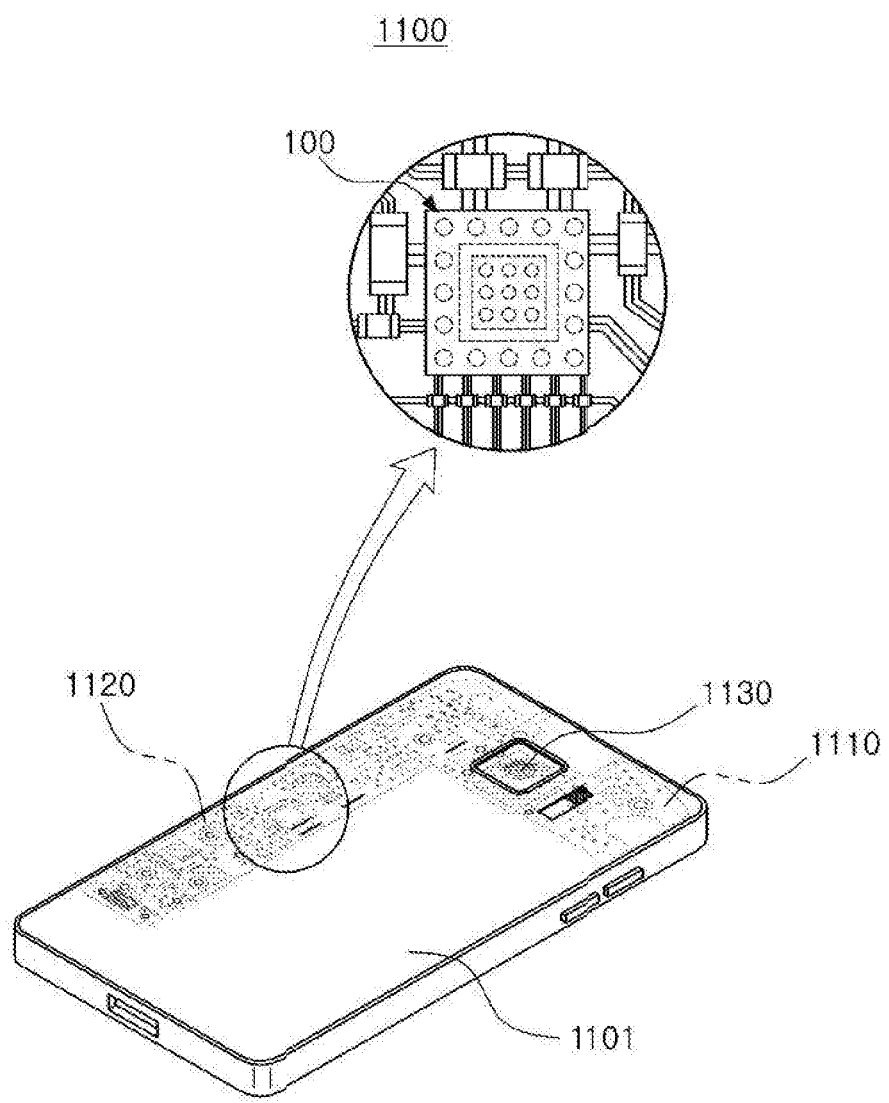
FIG. 2 is a schematic perspective view of an electronic device.

FIG. 2 is a schematic perspective view of an example electronic device 1100. In an embodiment, the electronic device 1100 may be or include one or more of the electronic devices 1000 mentioned above.

Referring to FIG. 2, a semiconductor package may be used for various purposes in the various electronic devices 1100 as described above. For example, a main board 1110 may be accommodated in a body 1101 of the electronic device 1100, which, as illustrated, may be a smartphone, and various electronic components 1120 may be physically or electrically connected to the main board 1110. However, the electronic device 1100 is not limited thereto. In addition, other components that may or may not be physically or electrically connected to the main board 1110, such as a camera module 1130, may be accommodated in the body 1101. Some of the electronic components 1120 may be the chip-related components, for example, an application processor, signal processor, etc. However, the electronic components 1120 are not limited thereto.

Semiconductor Package

Generally, multiple electrical circuits are integrated in a semiconductor chip. The semiconductor chip may be damaged due to external physical or chemical impacts. Therefore, the semiconductor chip may be packaged before using in an electronic device.

Here, semiconductor packaging may be required due to a difference in size of electrical connections between the semiconductor chip and a main board of the electronic device. In detail, a size of connection pads of the semiconductor chip and intervals between the connection pads of the semiconductor chip are substantially smaller than sizes of component mounting pads of the main board and intervals between the component mounting pads of the main board. Therefore, it may be difficult to directly mount the semiconductor chip on the main board, and packaging technology may reduce a difference in the size of the connections between the semiconductor chip and the main board.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
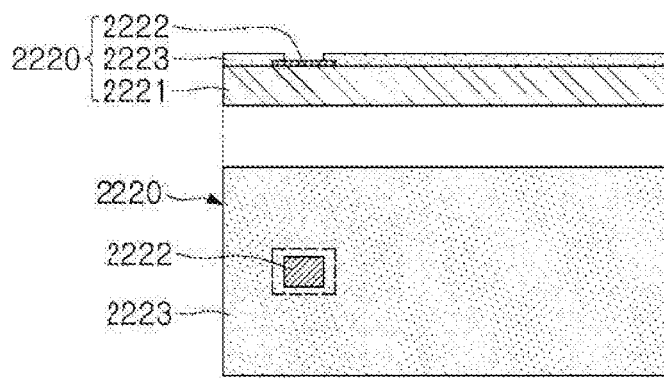
FIG. 3A is a schematic cross-sectional view of a fan-in semiconductor package prior to being packaged.
Figure 3B:
FIG. 3B illustrates a plan view of the fan-in semiconductor package of FIG. 3A.
Figure 3C:
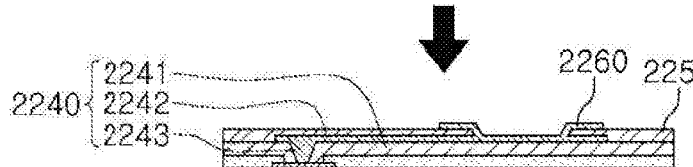
FIG. 3C is a schematic cross-sectional view of the fan-in semiconductor package of FIGS. 3A and 3B after being packaged.
Figure 3D:
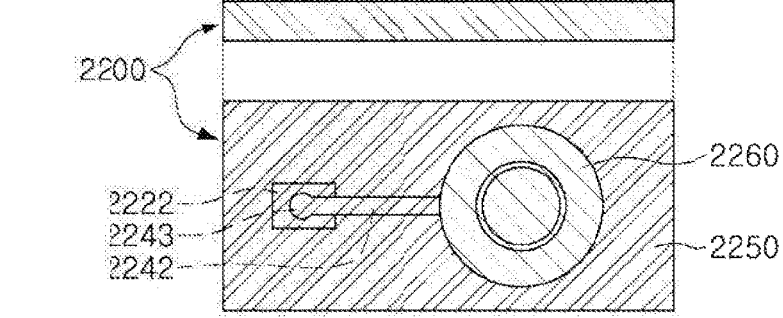
FIG. 3D illustrates a plan view of the fan-in semiconductor package of FIG. 3C.

FIG. 3A is a schematic cross-sectional view of a fan-in semiconductor package prior to being packaged. FIG. 3B illustrates a plan view of the fan-in semiconductor package of FIG. 3A. FIG. 3C is a schematic cross-sectional view of the fan-in semiconductor package of FIGS. 3A and 3B after being packaged. FIG. 3D illustrates a plan view of the fan-in semiconductor package of FIG. 3C.

FIGS. 4A-4G illustrate the processing steps for manufacturing the fan-in semiconductor package in FIGS. 3C-3D.

Referring to FIGS. 3A-3D and 4A-4G, a semiconductor chip 2220 may be, for example, an integrated circuit (IC) having a body 2221 including silicon (Si), germanium (Ge), gallium arsenide (GaAs), a combination thereof, and the like, connection pads 2222 formed on one surface of the body 2221 and including a conductive material such as aluminum (Al), a combination thereof and the like, and a passivation layer 2223 such as an oxide film, a nitride film, a combination thereof and the like, formed on one surface of the body 2221 and at least partially covering the connection pads 2222. Since the connection pads 2222 are relatively smaller in size, it is difficult to mount the integrated circuit (IC) on an intermediate level printed circuit board (PCB) as well as on the main board of the electronic device.

Figure 4A:
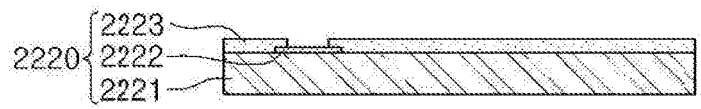
FIGS. 4A-4G illustrate the processing steps for manufacturing the fan-in semiconductor package in FIGS. 3C-3D.
Figure 4B:
Figure 4C:
Figure 4D:
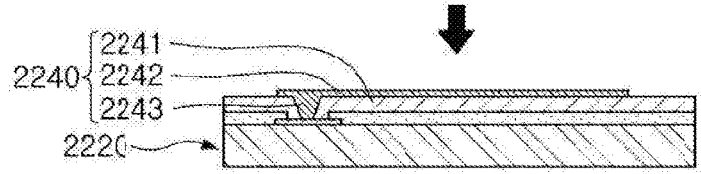

Therefore, an interconnection member 2240 may be formed on the semiconductor chip 2220, depending on a size thereof, in order to redistribute the connection pads 2222. FIG. 4A illustrates the fan-in semiconductor package of FIG. 3A. Referring to FIGS. 4B, 4C and 4D, to form the interconnection member 2240, an insulating layer 2241 may be deposited on the semiconductor chip 2220. More specifically, the insulating layer 2241 may be deposited over the passivation layer 2223 and the connection pads 2222. The insulating layer 2241 may include an insulating material such as photoimagable dielectric (PID) resin. As illustrated in FIGS. 4B and 4C, a via hole 2243*h* may then be formed in the insulating layer 2241 using photolithography and etching processes. Briefly, light 2217 of a specific wavelength is shined over the insulating layer 2241 through a mask 2215 having a pattern of the via hole 2243*h* formed therein. The etching process may be performed to remove the insulating layer 2241 to form the via 2243 (FIG. 4D).

Figure 4E:
Figure 4F:
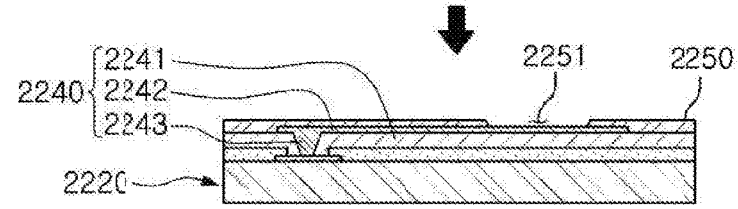

As illustrated in FIG. 4D, wiring patterns 2242 may then be formed on the insulating layer 2241 and in the via 2243 to connect to the connection pads 2222. Referring to FIGS. 4E and 4F, a passivation layer 2250 protecting the interconnection member 2240 may be formed, and photolithography and etching processes may be performed again to form an opening 2251 in the passivation layer 2250. Briefly, the photolithography and etching processes may include shining light on the passivation layer 2250 via a mask 2219 including a pattern corresponding to the opening 2251. The passivation layer 2250 is then etched away to form the opening 2251 and expose the underlying wiring patterns 2242.

Figure 4G:
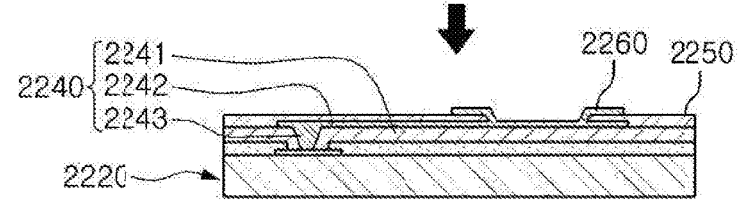

As illustrated in FIG. 4G, an under-bump metal layer 2260 may be deposited in the opening 2251, and the fan-in semiconductor package of FIG. 3D may be obtained. Thus, a fan-in semiconductor package 2200 including the semiconductor chip 2220, the interconnection member 2240, the passivation layer 2250, and the under-bump metal layer 2260 may be manufactured through multiple process steps.

As described above, in the fan-in semiconductor package, all of the connection pads 2222, which, for example, may function as input/output (I/O) terminals of the semiconductor chip 2220, are disposed inside the semiconductor chip 2220. As a result, the fan-in semiconductor package may have improved electrical characteristics and be produced at a low cost. Due to the low cost and improved electrical characteristics, variety of portable electronic devices, such as smartphones, media players, and the like, include components manufactured in fan-in semiconductor package form. Such components permit faster signal transfer and have a compact size.

Because of the relatively small size of the connection pads 2222 and the small interval (or separation) between adjacent connection pads 2222 of the semiconductor chip, an intermediate circuit (also referred to as an interposer substrate) may be used to mount the fan-in semiconductor package on the main board (e.g., main board 1010 in FIG. 1) of the electronic device.

Figure 5:
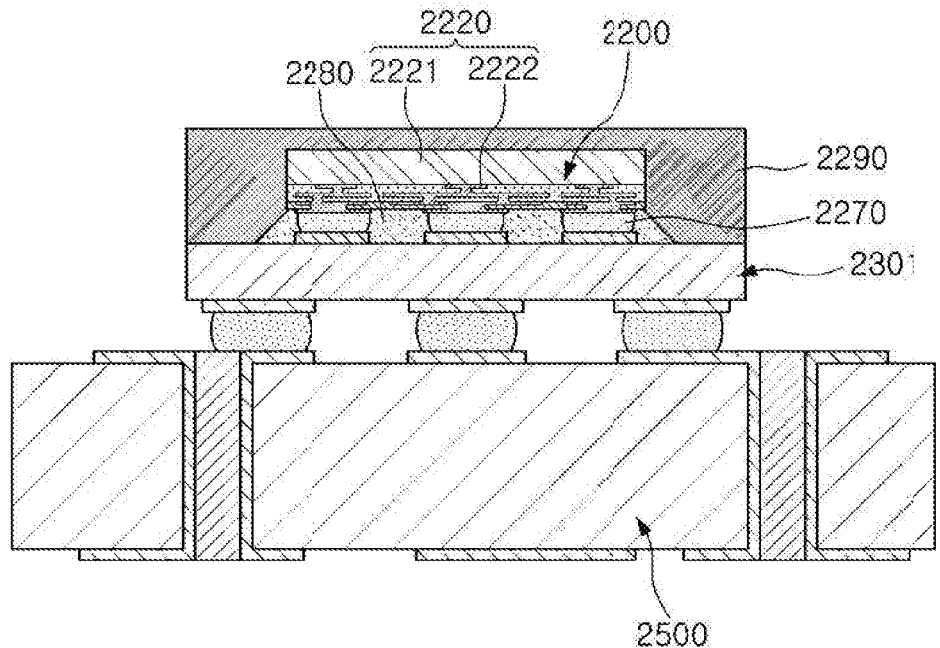
FIG. 5 is a schematic cross-sectional view of a fan-in semiconductor package mounted on an interposer substrate, which is mounted on a main board of an electronic device.

FIG. 5 is a schematic cross-sectional view of a fan-in semiconductor package mounted on an interposer substrate, which is mounted on a main board of an electronic device.

Figure 6:
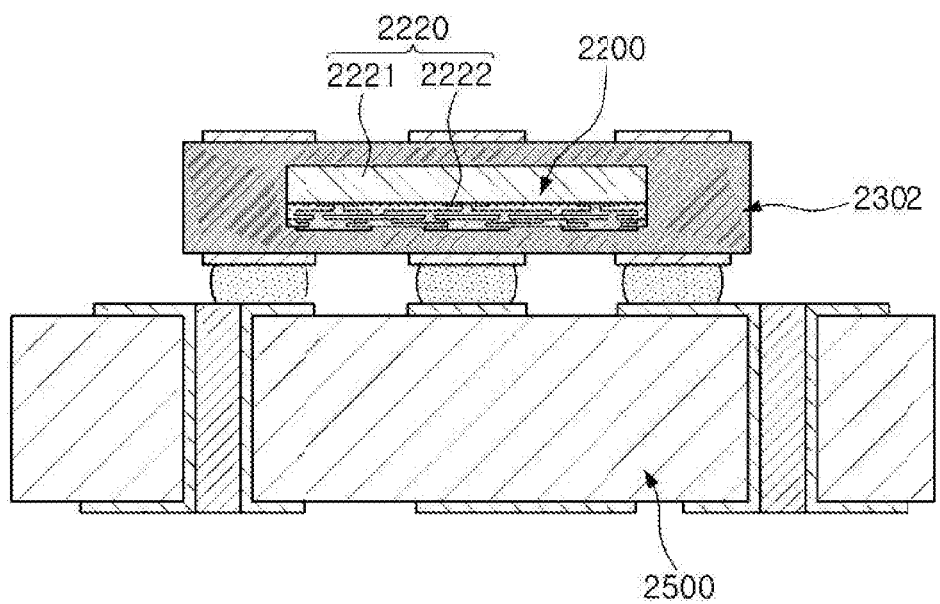
FIG. 6 is a schematic cross-sectional view of a fan-in semiconductor package embedded in an interposer substrate, which is mounted on a main board of an electronic device.

FIG. 6 is a schematic cross-sectional view of a fan-in semiconductor package embedded in an interposer substrate, which is mounted on a main board of an electronic device.

Referring to FIGS. 5 and 6, and with continued reference to FIGS. 3A-3*d* and 4, in a fan-in semiconductor package 2200, the connection pads 2222 of the semiconductor chip 2220 may be redistributed through an interposer substrate 2301, and the fan-in semiconductor package 2200 may be mounted on a main board (or mother board) 2500 of an electronic device by mounting the fan-in semiconductor package 2200 on the interposer substrate 2301. In this case, solder balls 2270, and the like, may be fixed to the semiconductor chip 2220 by an underfill resin 2280, or the like. The external surface of the semiconductor chip 2220 may be covered with a molding material 2290. Alternatively, as illustrated in FIG. 6, in order to redistribute the connection pads 2222 of the semiconductor chip 2220, the fan-in semiconductor package 2200 may be embedded in an interposer substrate 2302, and the fan-in semiconductor package 2200 may then be mounted on a main board 2500 of an electronic device.

Thus, connection pads 2222 having a relatively small size and small interval (or separation) may be connected to the main board of the electronic device.

Fan-Out Semiconductor Package

Figure 7:
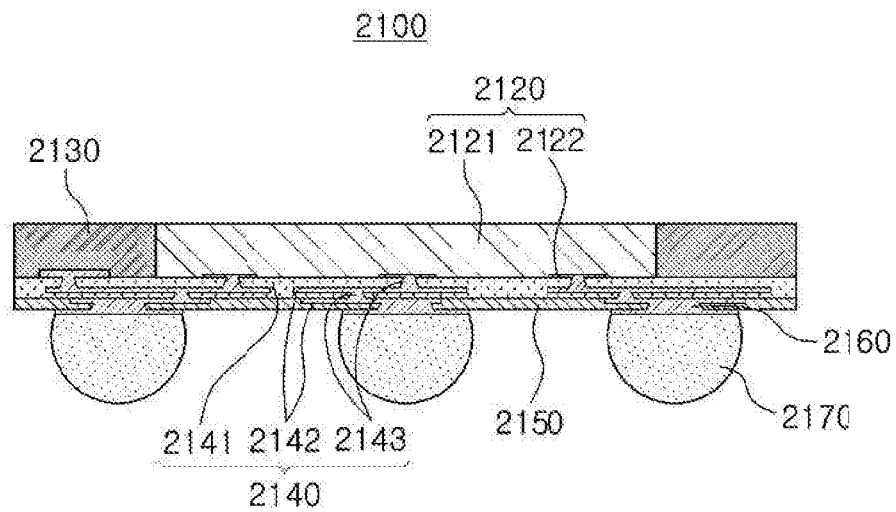
FIG. 7 is a schematic cross-sectional view of a fan-out semiconductor package.

FIG. 7 is a schematic cross-sectional view illustrating a fan-out semiconductor package 2100.

Referring to FIG. 7, the fan-out semiconductor package 2100 may include a semiconductor chip 2120 having a body 2121 that is protected by an encapsulant 2130. The connection pads 2122 of the semiconductor chip 2120 may be redistributed externally (or otherwise "brought" to the outside) of the semiconductor chip 2120 by an interconnection member 2140. As illustrated, a passivation layer 2150 may be formed or otherwise deposited on the interconnection member 2140, and an under-bump metal layer 2160 may be formed or otherwise deposited in openings of the passivation layer 2150. Solder balls 2170 may be formed or otherwise deposited on the under-bump metal layer 2160. The interconnection member 2140 may include an insulating layer 2141, redistribution layers 2142 formed on the insulating layer 2141, and vias 2143 electrically connecting the connection pads 2122 and the redistribution layers 2142 with each other.

As described above, in the fan-in semiconductor package, all connection pads of the semiconductor chip may be disposed inside the semiconductor chip. Therefore, when a size of the semiconductor chip is reduced, a size and a pitch of solder balls may also be reduced, and, therefore, a non-standardized ball layout may be used in the fan-in semiconductor package. On the other hand, in the fan-out semiconductor package disclosed in FIG. 7, the connection pads (I/O terminals) of the semiconductor chip are redistributed external to the semiconductor chip through the interconnection member formed on the semiconductor chip. Therefore, even if a size of the semiconductor chip is reduced, it may be possible to use a standardized ball layout in the fan-out semiconductor package. Thus, an interposer may not be required to mount the fan-out semiconductor package on the main board of the electronic device, as described below.

Figure 8:
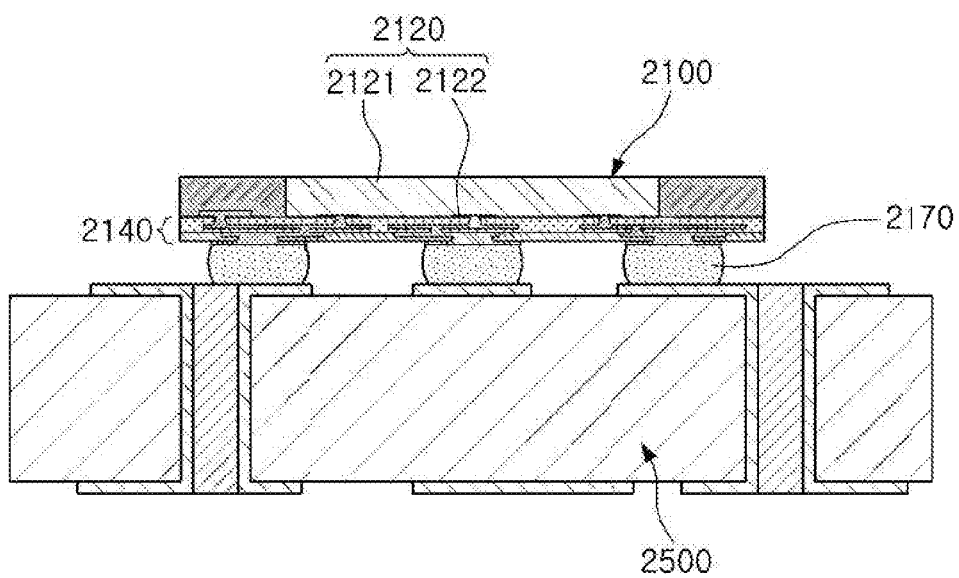
FIG. 8 is a schematic cross-sectional view of a fan-out semiconductor package mounted on a main board of an electronic device.

FIG. 8 is a schematic cross-sectional view of the fan-out semiconductor package 2100 mounted on a main board 2500 of an electronic device.

Referring to FIG. 8, the fan-out semiconductor package 2100 may be mounted on a main board 2500 of an electronic device using solder balls 2170, or similar connectors. The fan-out semiconductor package 2100 includes the interconnection member 2140 formed on the semiconductor chip 2120 for redistributing the connection pads 2122 to a fan-out region outside the semiconductor chip 2120, such that a standardized ball layout may be used in the fan-out semiconductor package 2100. As a result, the fan-out semiconductor package 2100 may be mounted on the main board 2500 of the electronic device without using a separate interposer substrate.

As described above, since the fan-out semiconductor package may be mounted on the main board of the electronic device without using the separate interposer substrate, a thickness of the fan-out semiconductor package may be lower than that of the fan-in semiconductor package using the interposer substrate. As a result, a size of the fan-out semiconductor package may be reduced. In addition, the fan-out semiconductor package has improved thermal characteristics and electrical characteristics, and a use thereof in a mobile device (e.g., smartphone) may be desirable. Thus, the fan-out semiconductor package may be more compact than a general package-on-package (POP) type semiconductor package using a printed circuit board (PCB) and warpage may be avoided.

As discussed above, in the fan-out semiconductor package, the semiconductor chip is mounted on the main board of the electronic device, and the semiconductor chip is protected from external impacts. In contrast, the fan-in semiconductor package is embedded in an interposer substrate, which is mounted on the main board of the electronic device.

A fan-out semiconductor package in which a bleeding (or flow) of an encapsulant is prevented or otherwise minimized and reliability of vias improved will hereinafter be described with reference to FIGS. 9 and 10.

Figure 9:
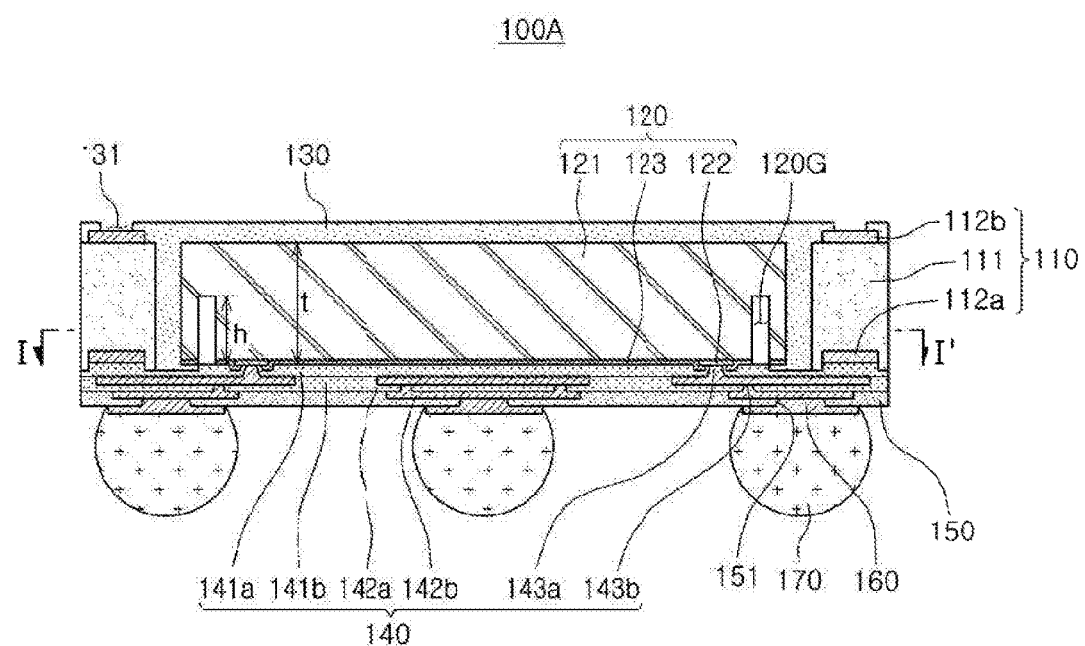
FIG. 9 is a schematic cross-sectional view of a fan-out semiconductor package.

FIG. 9 is a schematic cross-sectional view of an example fan-out semiconductor package 100A.

Figure 10:
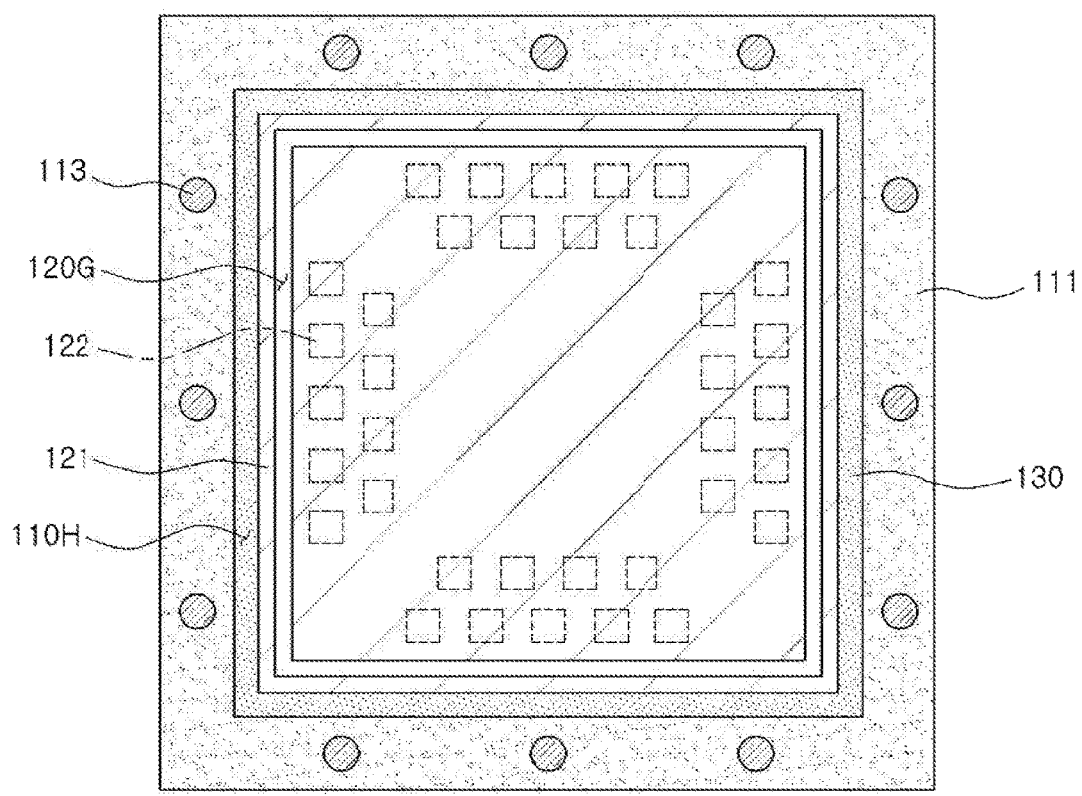
FIG. 10 is a schematic plan view taken along line I-I' of the fan-out semiconductor package of FIG. 9.

FIG. 10 is a schematic plan view taken along line I-I' of the fan-out semiconductor package 100A of FIG. 9.

Referring to FIGS. 9 and 10, the fan-out semiconductor package 100A according to an exemplary embodiment may include a first interconnection member 110 having a through-hole 110H and a semiconductor chip 120 disposed in the through-hole 110H of the first interconnection member 110 and having an active surface having connection pads 122 disposed thereon and an inactive surface opposite the active surface. The fan-out semiconductor package 100A may further include an encapsulant 130 encapsulating at least some of the first interconnection member 110 and the semiconductor chip 120, a second interconnection member 140 disposed on the first interconnection member 110 and the semiconductor chip 120, and a passivation layer 150 disposed on the second interconnection member 140. An under-bump metal layer 160 is disposed in openings 151 of the passivation layer 150 and connection terminals 170 are disposed on the under-bump metal layer 160. In this case, the semiconductor chip 120 may have a groove 120G formed between an edge of the semiconductor chip 120 and the connection pads 122 on the active surface thereof.

Figure 14:
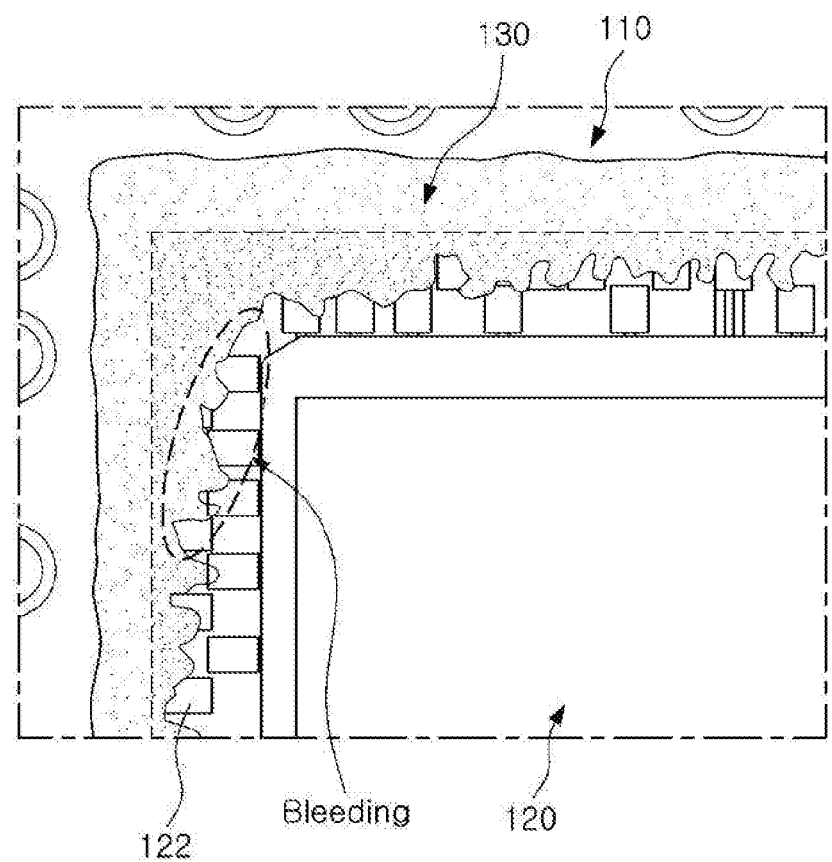
FIG. 14 illustrates an example of the fan-out semiconductor package depicting the encapsulant flowing into the connection pads and other components of the semiconductor chip.

Generally, in a fan-out semiconductor package, a semiconductor chip may be protected by covering an inactive surface and side surfaces of the semiconductor chip with an encapsulant. During an encapsulating process, the encapsulant may unintentionally bleed or otherwise flow into an active surface of the semiconductor chip before hardening. Referring briefly to FIG. 14 with continued reference to FIGS. 9 and 10, illustrated is an example of the fan-out semiconductor package depicting the encapsulant flowing into the connection pads and other components of the semiconductor chip. As illustrated, the encapsulant 130 has bled on the connection pads 122 disposed on the active surface of the chip 120. Therefore, connection pads 122 formed may be damaged by the encapsulant. When a redistribution layer 112a and 112b (FIGS. 9 and 10) connected to the connection pads 122 is formed in the subsequent process, manufacturing flaws, such as, an open defect of vias, a decrease in connectivity of the vias, electrical short-circuit, and the like, occur and reliability of the vias may be reduced.

On the other hand, in the fan-out semiconductor chip 100A according to the exemplary embodiment, the groove 120G may be formed between the edge of the semiconductor chip 120 and the connection pads 122 on the active surface of the semiconductor chip 120. As illustrated in FIG. 10, the groove 120G may be continuous along the edge (or periphery) of the semiconductor chip 120 and surround a plurality of connection pads 122. Therefore, as illustrated in FIG. 10, even if the encapsulant 130 flows towards the active surface of the semiconductor chip 120, the encapsulant 130 may be prevented from flowing onto the connection pads 122 by the groove 120G. As a result, the reliability of the vias may be increased.

Due to the groove 120G being continuously formed along the edge of the semiconductor chip 120, as in the exemplary embodiment, the portion of the active surface on which the encapsulant 130 may bleed or otherwise flow may be minimized. The groove 120G may extend from the active surface of the semiconductor chip 120 toward the inactive surface of the semiconductor chip 120 and have a predetermined depth h. In an example, the depth h may be around ⅔ of a thickness t of the semiconductor chip 120. At this depth h, the efficiency of the groove 120G in preventing the encapsulant 130 from flowing on the connection pads 122 may be increased.

The respective components included in the fan-out semiconductor package 100A according to the exemplary embodiment will hereinafter be described in more detail.

The first interconnection member 110 may maintain rigidity of the fan-out semiconductor package 100A and maintain the uniformity of a thickness of the encapsulant 130. In addition, the first interconnection member 110 may include redistribution layers 112a and 112b for redistributing the connection pads 122 of the semiconductor chip 120 and reduce the number of layers of the second interconnection member 140. The first interconnection member 110 may have the through-hole 110H having the semiconductor chip 120 disposed therein and spaced apart from the first interconnection member 110 by a predetermined distance. Side surfaces of the semiconductor chip 120 may be surrounded by the first interconnection member 110. However, this arrangement is merely an example, and the placement of the first interconnection member 110 and the chip 120 may be varied, without departing from the scope of the disclosure.

The first interconnection member 110 may include an insulating layer 111 in contact with the second interconnection member 140, a first redistribution layer 112a in contact with the second interconnection member 140 and embedded in the insulating layer 111, and a second redistribution layer 112b disposed on the surface of the insulating layer 111 opposite the surface of the insulating layer 111 in which the first redistribution layer 112a is embedded. In addition, the first interconnection member 110 may include vias 113 penetrating through the insulating layer 111 and electrically connecting the first and second redistribution layers 112a and 112b to each other. Since the first redistribution layer 112a is embedded in the insulating layer 111, an extent of an insulating layer 141a of the second interconnection member 140 may be relatively constant. The first redistribution layer 112a may be recessed in the insulating layer 111, such that a lower surface of the insulating layer 111 may have a step with respect to a lower surface of the first redistribution layer 112a. As a result, the flow of the encapsulant 130 into the first redistribution layer 112a may be minimized.

The insulating layer 111 may be or include insulating material an epoxy resin, a thermoplastic resin such as a polyimide resin, a resin having a reinforcing material such as a glass cloth or an inorganic filler impregnated in the thermosetting resin and the thermoplastic resin, for example, prepreg, Ajinomoto Build up Film (ABF), FR-4, Bismaleimide Triazine (BT), a combination thereof and the like. Additionally or alternatively, a photoimagable dielectric (PID) resin may also be used as the insulating material.

The redistribution layers 112a and 112b may redistribute the connection pads 122 of the semiconductor chip 120, and each of the redistribution layers 112a and 112b may include a conductive material such as copper (Cu), aluminum (Al), silver (Ag), tin (Sn), gold (Au), nickel (Ni), lead (Pb), titanium (Ti), alloys thereof, and the like. The redistribution layers 112a and 112b may perform various functions depending on designs of their corresponding layers. For example, the redistribution layers 112a and 112b may serve as a ground (GND) pattern, a power (PWR) pattern, a signal (S) pattern, and the like. Here, the signal (S) pattern may include data signals, control signals, command signals and the like. In addition, the redistribution layers 112a and 112b may function as a via pad, a connection terminal pad, and the like.

A surface treatment layer (not illustrated) may be formed on portions of the redistribution layer 112b exposed through openings 131 formed in the encapsulant 130. The surface treatment layer may be formed using techniques such as, electrolytic gold plating, electroless gold plating, organic solderability preservative (OSP) or electroless tinplating, electroless silver plating, electroless nickel plating/substituted gold plating, direct immersion gold (DIG) plating, hot air solder leveling (HASL), a combination thereof and the like.

The vias 113 may electrically connect the redistribution layers 112a and 112b formed on different layers to each other, resulting in an electrical path in the first interconnection member 110. The vias 113 may include a conductive material such as copper (Cu), aluminum (Al), silver (Ag), tin (Sn), gold (Au), nickel (Ni), lead (Pb), titanium (Ti), alloys thereof, and the like. Each of the vias 113 may be entirely filled with the conductive material. Alternatively, the conductive material may be formed along a wall of each of via holes. The shapes of the vias 113 are not limited to any particular shape and the shape of the visa 113 may be tapered, cylindrical, and the like.

The semiconductor chip 120 may be an integrated circuit (IC) including several hundreds to several millions of components integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto.

The semiconductor chip 120 may include a body 121 including silicon (Si), germanium (Ge), gallium arsenide (GaAs), a combination thereof and the like. Various circuits may be formed on the body 121. The connection pads 122 may electrically connect the semiconductor chip 120 to other components. Each connection pad 122 may include a conductive material such as aluminum (Al), or the like. A passivation layer 123 exposing the connection pads 122 may be formed on the body 121, and may be an oxide film, a nitride film, or the like, or a double layer of an oxide layer and a nitride layer. An insulating layer (not illustrated), and the like, may be further disposed on the chip 120 in desired portions thereof.

The encapsulant 130 may protect the first interconnection member 110 and/or the semiconductor chip 120. As illustrated, the encapsulant 130 may cover upper surfaces of the first interconnection member 110 and the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second interconnection member 140. Meanwhile, the encapsulant 130 may fill the through-hole 110H to may function as an adhesive and reduce buckling of the semiconductor chip 120.

The encapsulant 130 may include an insulating material, such as a thermosetting resin such as an epoxy resin, a thermoplastic resin such as a polyimide resin, or a resin, having a reinforcing material, such as an inorganic filler impregnated in the thermosetting resin and the thermoplastic resin, for example, ABF, FR-4, BT, a PID resin, or the like. In addition, a molding material such as an epoxy molding compound (EMC), or the like, may also be used.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 (described below), depending on the different applications of the chip 120. The second interconnection member 140 may include insulating layers 141a and 141b, the redistribution layers 142a and 142b disposed on the insulating layers 141a and 141b, respectively, and vias 143a and 143b penetrating through the insulating layers 141a and 141b, respectively, and connecting the redistribution layers 142a and 142b to each other. Although the second interconnection member 140 is illustrated as including two redistribution layers 142a and 142b, in other embodiments, the second interconnection member 140 may include a single layer or more than two redistribution layers.

Each insulating layer 141a and 141b may include an insulating material. In an example, a photosensitive insulating material such as a photoimagable dielectric (PID) resin may also be used as the insulating material. In this case, each of the insulating layers 141a and 141b may have a relatively smaller thickness, and a smaller pitch of each of the vias 143a and 143b may be achieved with relative ease. Materials of the insulating layers 141a and 141b may be the same as each other or may be different from each other. The insulating layers 141a and 141b may be integrated with each other such that the insulating layers 141a and 141b merge into each other at the interface therebetween and a discrete boundary therebetween may be absent.

The redistribution layers 142a and 142b may be used to redistribute the connection pads 122. A material of each of the redistribution layers 142a and 142b may be a conductive material such as copper (Cu), aluminum (Al), silver (Ag), tin (Sn), gold (Au), nickel (Ni), lead (Pb), titanium (Ti), or alloys thereof. The redistribution layers 142a and 142b may perform various functions depending on designs of their corresponding layers. For example, the redistribution layers 142a and 142b may serve as a ground (GND) pattern, a power (PWR) pattern, a signal (S) pattern, and the like. Here, the signal (S) pattern may include data signals, control signals, command signals, and the like. In addition, the redistribution layers 142a and 142b may function as a via pad, a connection terminal pad, and the like.

A surface treatment layer (not illustrated) may further be formed on portions of the redistribution layer 142b exposed from the redistribution layers 142a and 142b, if required. The surface treatment layer may be formed by, for example, electrolytic gold plating, electroless gold plating, OSP or electroless tin plating, electroless silver plating, electroless nickel plating/substituted gold plating, DIG plating, HASL, or other processes known in the art.

The vias 143a and 143b may electrically connect the redistribution layers 142a and 142b and the connection pads 122 formed on different layers to each other, resulting in an electrical path in the fan-out semiconductor package 100A. Each of the vias 143a and 143b may be a conductive material such as copper (Cu), aluminum (Al), silver (Ag), tin (Sn), gold (Au), nickel (Ni), lead (Pb), titanium (Ti), alloys thereof, and the like. Either each of the vias 143a and 143b may be entirely filled with the conductive material, or the conductive material may be formed along a wall of each of the vias. The shapes of the vias 143a and 143b are not limited to any particular shape and the shape of the visa 143a and 143b may be tapered, cylindrical, and the like.

Meanwhile, a lower surface of the first redistribution layer 112a of the first interconnection member 110 may be disposed on a level above a lower surface of the connection pad 122 of the semiconductor chip 120. In addition, a distance between a redistribution layer 142a of the second interconnection member 140 and the first redistribution layer 112a of the first interconnection member 110 may be greater than that between the redistribution layer 142a of the second interconnection member 140 and the connection pad 122 of the semiconductor chip 120. Here, the first redistribution layer 112a may be recessed into the insulating layer 111.

Meanwhile, thicknesses of the redistribution layers 112a and 112b of the first interconnection member 110 may be greater than those of the redistribution layers 142a and 142b of the second interconnection member 140. Since the first interconnection member 110 may have a thickness equal to or greater than that of the semiconductor chip 120, the redistribution layers 112a and 112b formed in the first interconnection member 110 may also be relatively thicker, depending on a scale of the first interconnection member 110. On the other hand, the redistribution layers 142a and 142b of the second interconnection member 140 may be relatively thinner.

The fan-out semiconductor package 100A according to the exemplary embodiment may further include the passivation layer 150 disposed on the second interconnection member 140. The passivation layer 150 may be configured to protect the second interconnection member 140 from external physical or chemical damage. The passivation layer 150 may have the openings 151 that expose portions of the redistribution layer 142b of the second interconnection member 140. Each of the openings 151 may expose the entirety or only a portion of a surface of the redistribution layer 142b.

A material of the passivation layer 150 is not limited to any specific material. In an example, a photosensitive insulating material such as a PID resin may be used. Alternatively, a solder resist may also be used as the passivation layer 150. Alternatively, an insulating resin that does not include a glass cloth, but has a filler impregnated therein, for example, ABF including an inorganic filler and an epoxy resin, or the like, may be used as the passivation layer 150. In this case, a material satisfying Equations 1 to 4 may be used for the passivation layer 150. Resultantly, board level reliability of the fan-out semiconductor package may be improved.

$$\text{Elastic Modulus} \times \text{Coefficient of Thermal Expansion} \leq 230 \text{ GPa·ppm/}^\circ\text{C.} \quad \text{Equation 1:}$$

$$\text{Thickness} \geq 10 \text{ μm} \quad \text{Equation 2:}$$

$$\text{Surface Roughness} \geq 1 \text{ nm} \quad \text{Equation 3:}$$

$$\text{Moisture Absorption Ratio} \leq 1.5\% \quad \text{Equation 4:}$$

The fan-out semiconductor package 100A according to the exemplary embodiment may further include the under-bump metal layer 160 disposed in the openings 151 of the passivation layer 150 and the exposed redistribution layer 142b of the second interconnection member 140. The under-bump metal layer 160 may improve reliability of the connection with connection terminals 170 (described below), resulting in an overall improvement of reliability of the fan-out semiconductor package 100A. The under-bump metal layer 160 may be formed by known metallization method using the known conductive material such as a metal.

The fan-out semiconductor package 100A according to the exemplary embodiment may further include the connection terminals 170 disposed on the under-bump metal layer 160. The connection terminals 170 may be configured to externally connect (physically or electrically) the fan-out semiconductor package 100A. For example, the fan-out semiconductor package 100A may be mounted on the main board of the electronic device through the connection terminals 170. Each of the connection terminals 170 may include a conductive material, for example, a solder, or the like. However, a material of each of the connection terminals 170 is not limited thereto.

Each of the connection terminals 170 may be a land, a ball, a pin, a combination thereof, and the like. The connection terminals 170 may be formed as a multilayer or monolayer structure. When the connection terminals 170 are formed as a multilayer structure, the connection terminals 170 may include a copper (Cu) pillar and a solder. When the connection terminals 170 are formed as a monolayer structure, the connection terminals 170 may include a tin-silver solder or copper (Cu). However, this is only an example, and the connection terminals 170 are not limited thereto. The number, an interval, or a disposition, of the connection terminals 170 is not particularly limited, and may be sufficiently modified depending on design particulars. For example, the number of connection terminals 170 provided may be in the range of several tens to several thousands based on the number of connection pads 122 of the semiconductor chip 120, but are not limited thereto, and the number of connection terminals 170 may be higher or lower.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have substantially improved reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may have a relatively reduced thickness, and costs.

Although not illustrated in the drawings, a metal layer may be further disposed on an inner wall of the through-hole 110H of the first interconnection member 110. Stated otherwise, the side surfaces of the semiconductor chip 120 may also be surrounded by the metal layer. Heat generated from the semiconductor chip 120 may be effectively dissipated upwardly or downwardly of the fan-out semiconductor package 100A through the metal layer, and electromagnetic waves may be effectively blocked through the metal layer.

If required, a plurality of semiconductor chips (not illustrated) may be disposed in the through-hole 110H of the first interconnection member 110. In an example, multiple through-holes 110H may be formed in the first interconnection member 110 and semiconductor chips may be disposed in the through-holes. In addition, passive components (not illustrated) such as a condenser, an inductor, and the like, may be encapsulated together with the semiconductor chip in the through-hole 110H. In addition, a surface-mount technology component (not illustrated) may be mounted on the passivation layer 150.

The fan-out semiconductor package 100A according to the exemplary embodiment may be manufactured using the process steps described below.

The first interconnection member 110 may first be prepared. The first interconnection member 110 may be prepared by forming the redistribution layer 112a on one surface of a carrier film having metal layers formed on opposite surfaces thereof, forming the insulating layer 111 covering the redistribution layer 112a, and forming the vias 113 penetrating through the insulating layer 111 and the redistribution layer 112b disposed on the insulating layer 111. Then, the first interconnection member 110 formed on one surface of the carrier film may be separated from the carrier film, and the through-hole 110H may be formed in the first interconnection member 110. Then, an adhesive film, or the like, may be attached to one surface of the first interconnection member 110, and the semiconductor chip 120 may be disposed in face-down form (e.g., active surface facing downward in FIG. 9) in the through-hole 110H of the first interconnection member 110. Then, the semiconductor chip 120 may be encapsulated with the encapsulant 130. As discussed above, the groove 120G in the semiconductor chip 120 may minimize flow of the encapsulant 130 into the connection pads 122 of the semiconductor chip 120 before being hardened. The groove 120G may be formed using a known processing method. For example, the groove 120G may be formed by drilling into active surface of the chip 120 using mechanical and/or laser techniques, by a sandblasting method using particles for polishing, by a dry etching method using plasma, a combination thereof, and the like. However, the method of forming the groove 120G is not limited to any specific method and any desired method may be used, without departing from the scope of the disclosure.

Then, the adhesive film may be removed, and the second interconnection member 140 may be formed in a region in which the adhesive film is removed. The second interconnection member 140 may be formed by sequentially forming the insulating layers 141a and 141b and then forming the redistribution layers 142a and 142b and the vias 143a and 143b on and in the insulating layers 141a and 141b, respectively, by the plating process as described above, or the like. Then, the openings 151 may be formed in the passivation layer 150 to expose portions of the redistribution layer 142b of the second interconnection member 140, and the under-bump metal layer 160 may be formed in the openings 151 by known metallization methods. Then, the connection terminals 170 may be formed on the under-bump metal layer 160. A method of forming the connection terminals 170 is not limited to any particular method and the connection terminals 170 may be formed by a method well-known in the art depending on their structures or forms. The connection terminals 170 may be fixed by reflow, and portions of the connection terminals 170 may be embedded in the passivation layer 150 in order to improve fixing force, and the remaining portions of the connection terminals 170 may be externally exposed, such that reliability may be improved. If necessary, the openings 131 exposing the redistribution layer 112b of the first interconnection member 110 may be formed in order to be used for marking, connection of a package-on-package (POP), mounting of a surface-mount technology (SMT) component, and the like. The openings 131 may penetrate through the encapsulant 130, and may be formed after the encapsulant 130 is formed.

The process may then include preparing the carrier film having a relatively large size, manufacturing a plurality of fan-out semiconductor packages 100A through the above-mentioned process, and then obtaining individual fan-out semiconductor packages 100A from the plurality of fan-out semiconductor packages using a cutting process in order to facilitate mass production. As a result, productivity may be increased.

Figure 11:
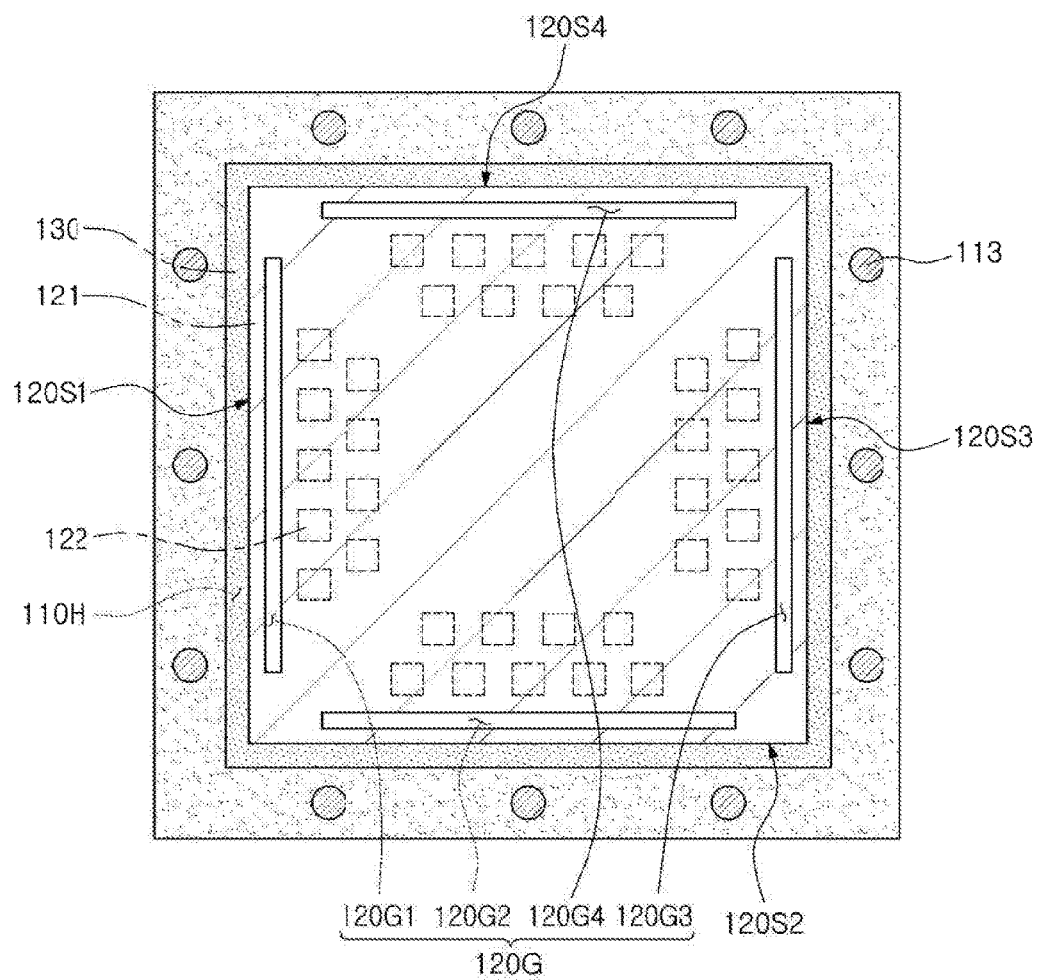
FIG. 11 is another exemplary schematic plan view taken along line I-I' of the fan-out semiconductor package of FIG. 9.

FIG. 11 is another exemplary schematic plan view taken along line I-I' of the fan-out semiconductor package of FIG. 9. The fan-out semiconductor package in FIG. 11 may be similar in some respects to the fan-out semiconductor package 100A in FIGS. 9 and 10, and therefore may be best understood with reference thereto where like numerals designate like components not described again in detail.

Referring to FIG. 11, in another example, a groove 120G may include a plurality of discrete (individual or disconnected) grooves 120G1, 120G2, 120G3, and 120G4 formed along the edges 120S1, 120S2, 120S3, and 120S4 of the semiconductor chip 120, respectively. In more detail, the plurality of grooves 120G1, 120G2, 120G3, and 120G4 may include first to fourth grooves 120G1, 120G2, 120G3, and 120G4 formed, respectively, along first to fourth edges 120S1, 120S2, 120S3, and 120S4, and disconnected from each other in or around corner portions of the semiconductor chip 120. As described above, the plurality of grooves 120G1, 120G2, 120G3, and 120G4 may also minimize flow of the encapsulant 130 onto the plurality of connection pads 122. However, some of the encapsulant 130 may flow into the corner portions that are not protected by the groove 120G.

Figure 12:
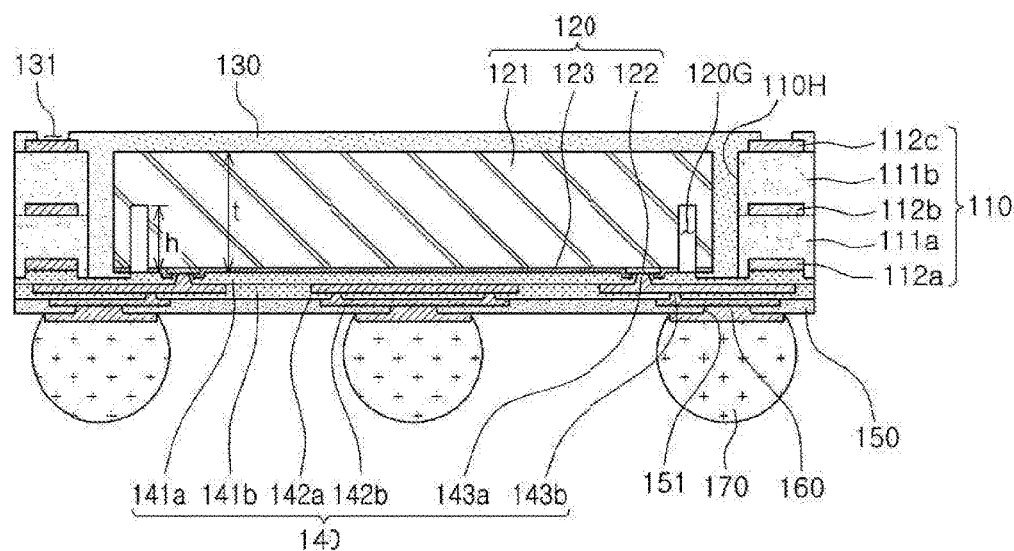
FIG. 12 is a schematic cross-sectional view of another fan-out semiconductor package.

FIG. 12 is a schematic cross-sectional view of another fan-out semiconductor package 100B. The fan-out semiconductor package 100B may be similar in some respects to the fan-out semiconductor package 100A in FIGS. 9 and 10, and therefore may be best understood with reference thereto where like numerals designate like components not described again in detail.

Referring to FIG. 12, the fan-out semiconductor package 100B according to another exemplary embodiment may include a first interconnection member 110 having a through-hole 110H, a semiconductor chip 120 disposed in the through-hole 110H and having an active surface having connection pads 122 disposed thereon and an inactive surface opposite the active surface, and an encapsulant 130 encapsulating at least some portions of the first interconnection member 110 and the semiconductor chip 120. The fan-out semiconductor package 100B may further include a second interconnection member 140 disposed on the first interconnection member 110 and the semiconductor chip 120, a passivation layer 150 disposed on the second interconnection member 140, an under-bump metal layer 160 disposed in openings 151 of the passivation layer 150, and connection terminals 170 disposed on the under-bump metal layer 160. In this case, the semiconductor chip 120 may have a groove 120G formed between a peripheral edge of the semiconductor chip 120 and the connection pads 122 on the active surface thereof.

The first interconnection member 110 may include a first insulating layer 111a in contact with the second interconnection member 140, a first redistribution layer 112a in contact with the second interconnection member 140 and embedded in the first insulating layer 111a, a second redistribution layer 112b disposed on the surface of the first insulating layer 111a opposite the surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. In the fan-out semiconductor package 100B, the first interconnection member 110 may include an increased number of redistribution layers 112a, 112b, and 112c to further simplify the process of forming the second interconnection member 140. Therefore, defects occurring when forming the second interconnection member 140 may be reduced and the yield may be improved. Although not illustrated in the drawing, the first to third redistribution layers 112a, 112b, and 112c may be electrically connected to each other by vias (not illustrated) penetrating through the first and second insulating layers 111a and 111b.

A lower surface of the first redistribution layer 112a of the first interconnection member 110 may be disposed on a level above a lower surface of the connection pad 122 of the semiconductor chip 120. In addition, a distance between a redistribution layer 142a of the second interconnection member 140 and the first redistribution layer 112a of the first interconnection member 110 may be greater than that between the redistribution layer 142a of the second interconnection member 140 and the connection pad 122 of the semiconductor chip 120. Here, the first redistribution layer 112a may be recessed into the first insulating layer 111a.

The second redistribution layer 112b of the first interconnection member 110 may be disposed between the active surface and the inactive surface of the semiconductor chip 120. The first interconnection member 110 may have a thickness corresponding to that of the semiconductor chip 120.

Thicknesses of the redistribution layers 112a, 112b, and 112c of the first interconnection member 110 may be greater than those of the redistribution layers 142a and 142b of the second interconnection member 140. Since the first interconnection member 110 may have a thickness equal to or greater than that of the semiconductor chip 120, the redistribution layers 112a, 112b, and 112c may be formed to be relatively large, depending on a scale of the first interconnection member 110. On the other hand, the redistribution layers 142a and 142b of the second interconnection member 140 may be relatively thin.

Figure 13:
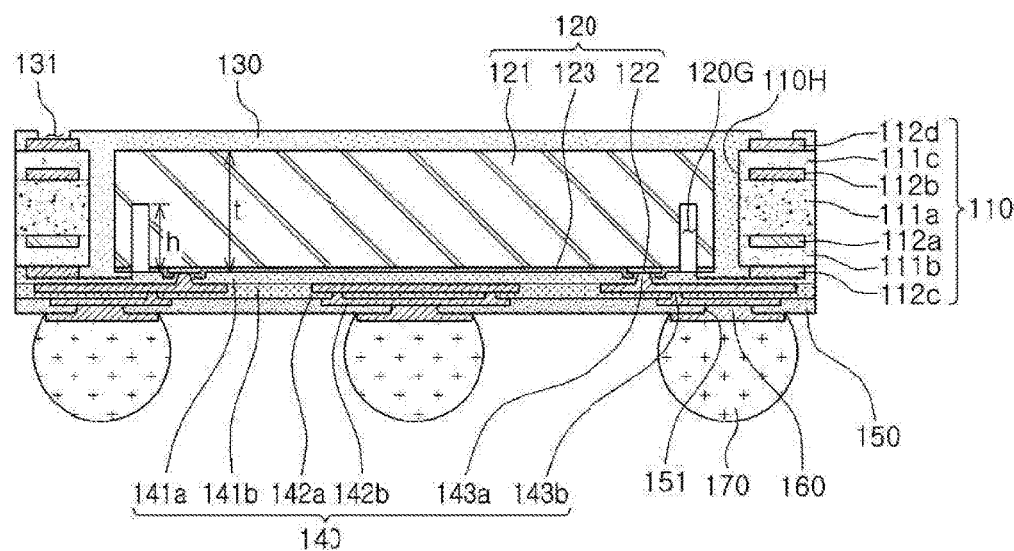
FIG. 13 is a schematic cross-sectional view of yet another fan-out semiconductor package.

FIG. 13 is a schematic cross-sectional view of yet another fan-out semiconductor package 100C. The fan-out semiconductor package 100C may be similar in some respects to the fan-out semiconductor packages 100A and 100B in FIGS. 9, 10, and 12, and therefore may be best understood with reference thereto where like numerals designate like components not described again in detail.

Referring to FIG. 13, a fan-out semiconductor package 100C according to another exemplary embodiment may include a first interconnection member 110 having a through-hole 110H, a semiconductor chip 120 disposed in the through-hole 110H of the first interconnection member 110 and having an active surface having connection pads 122 disposed thereon and an inactive surface opposite the active surface, an encapsulant 130 encapsulating at least some portions of the first interconnection member 110 and the semiconductor chip 120, and a second interconnection member 140 disposed on the first interconnection member 110 and the semiconductor chip 120. The fan-out semiconductor package 100C may further include a passivation layer 150 disposed on the second interconnection member 140, an under-bump metal layer 160 disposed in openings 151 of the passivation layer 150, and connection terminals 170 disposed on the under-bump metal layer 160. In this case, the semiconductor chip 120 may have a groove 120G formed between a peripheral edge of the semiconductor chip 120 and the connection pads 122 on the active surface thereof.

The first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. In the fan-out semiconductor package 100C, the first interconnection member 110 may include a higher number of redistribution layers 112a, 112b, 112c, and 112d to further simplify the process of forming the second interconnection member 140. Therefore, defects occurring when forming the second interconnection member 140 may be reduced and the yield may be improved. The first to fourth redistribution layers 112a, 112b, 112c, and 112d may be electrically connected to each other by through-wirings (not illustrated) and vias (not illustrated) penetrating through the first to third insulating layers 111a, 111b, and 111c.

The first insulating layer 111a may have a thickness greater than the thicknesses of the second insulating layer 111b and the third insulating layer 111c. The first insulating layer 111a may be relatively thick in order to maintain rigidity, and the second insulating layer 111b and the third insulating layer 111c may be introduced in order to increase the number of redistribution layers 112c and 112d formed. The first insulating layer 111a may include an insulating material different from those of the second insulating layer 111b and the third insulating layer 111c. For example, the first insulating layer 111a may be formed of, for example, prepreg including a glass cloth, an inorganic filler, and an insulating resin, and the second insulating layer 111b and the third insulating layer 111c may be formed of an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first interconnection member 110 may be disposed on a level below a lower surface of the connection pad 122 of the semiconductor chip 120. In addition, a distance between a redistribution layer 142a of the second interconnection member 140 and the third redistribution layer 112c of the first interconnection member 110 may be smaller than that between the redistribution layer 142a of the second interconnection member 140 and the connection pad 122 of the semiconductor chip 120. Here, the third redistribution layer 112c may protrude from the second insulating layer 111b, and may contact the second interconnection member 140.

The first redistribution layer 112a and the second redistribution layer 112b of the first interconnection member 110 may be disposed between the active surface and the inactive surface of the semiconductor chip 120. The first interconnection member 110 may have a thickness similar to that of the semiconductor chip 120.

Thicknesses of the redistribution layers 112a, 112b, 112c, and 112d of the first interconnection member 110 may be greater than that of the redistribution layers 142a and 142b of the second interconnection member 140. Since the first interconnection member 110 may have a thickness equal to or greater than that of the semiconductor chip 120, the redistribution layers 112a, 112b, 112c, and 112d may also be formed to have large sizes. On the other hand, the redistribution layers 142a and 142b of the second interconnection member 140 may be relatively thin.

Figure 15:
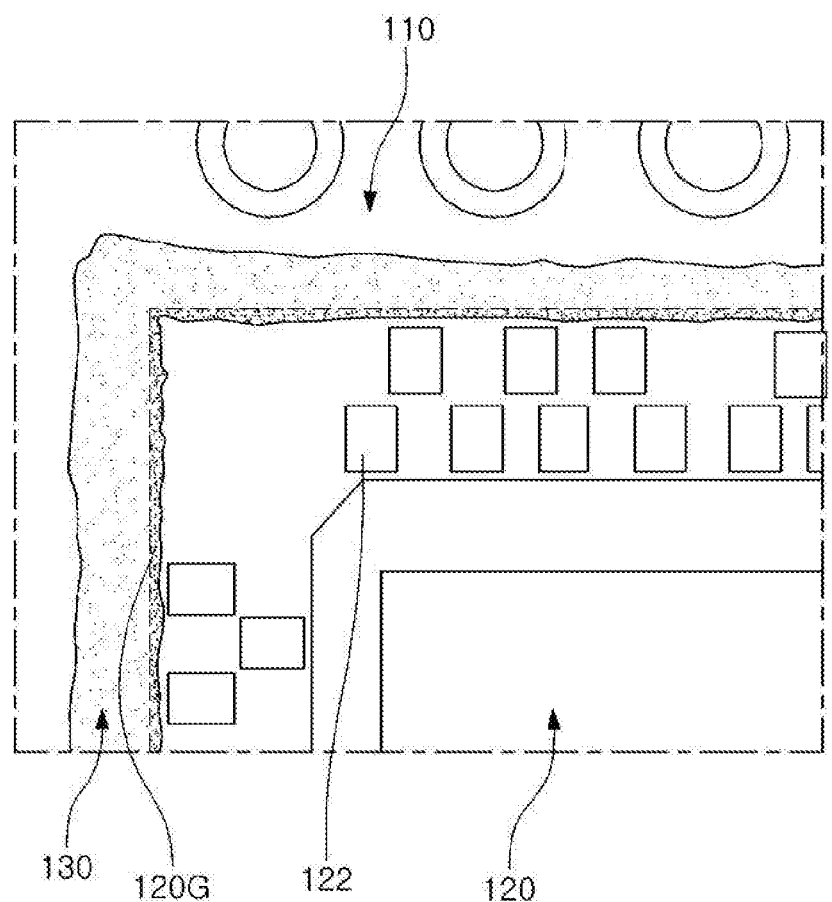
FIG. 15 illustrates an example of the fan-out semiconductor package, wherein the bleeding of the encapsulant into the connection pads and other components of the semiconductor chip is minimized.

FIG. 15 illustrates an example of the fan-out semiconductor package, wherein the bleeding of the encapsulant is minimized.

As illustrated, when the groove 120G is formed in the semiconductor chip 120, if the encapsulant 130 flows towards the active surface of the semiconductor chip 120 on which the connection pads 122 are formed, the encapsulant 130 may enter the groove 120G and may not contact the connection pads 122. Therefore, the reliability of the vias may be increased.

As set forth above, according to the exemplary embodiments, disclosed is a fan-out semiconductor package wherein the flow of an encapsulant is minimized and reliability of vias is improved.

While exemplary embodiments have been shown and described above, it will be apparent to those skilled in the art that modifications and variations could be made without departing from the scope of the present disclosure as defined by the appended claims.

What is claimed is:

1. A semiconductor package comprising:
a semiconductor chip having an active surface including connection pads disposed thereon and an inactive surface opposite the active surface;
an encapsulant encapsulating at least some portions of the semiconductor chip; and
a second interconnection member including an insulating layer, on which the semiconductor chip and the encapsulant are disposed, and a redistribution layer electrically connected to the connection pads of the semiconductor chip,
wherein the semiconductor chip has a groove in the active surface, the groove being disposed between a peripheral region of the semiconductor chip and a central region of the semiconductor chip on which the connection pads of the semiconductor chip are disposed,
the encapsulant includes a portion disposed between the insulating layer of the second interconnection member and the peripheral region of the semiconductor chip, and
the insulating layer of the second interconnection member is in direct contact with at least a portion of the central region of the semiconductor chip.

2. The semiconductor package of claim 1, wherein the groove has a loop shape along peripheral edges of the semiconductor chip.

3. The semiconductor package of claim 1, wherein the groove includes a plurality of discrete grooves, each groove defined along an edge of the semiconductor chip.

4. The semiconductor package of claim 1, wherein the groove is recessed from the active surface of the semiconductor chip toward the inactive surface of the semiconductor chip.

5. The semiconductor package of claim 4, wherein a depth at which the groove is recessed equal to about two-thirds of a thickness of the semiconductor chip.

6. The semiconductor package of claim 1, wherein the encapsulant covers the inactive surface of the semiconductor chip.

7. The semiconductor package of claim 1, further comprising a first interconnection member having a through-hole, in which the semiconductor chip is disposed, wherein the encapsulant encapsulates a portion of the first interconnection member and fills a portion of the through-hole to cover side surfaces of the semiconductor chip, the first interconnection member includes a first insulating layer, a first redistribution layer in contact with the second interconnection member and embedded in the first insulating layer, and a second redistribution layer disposed on a surface of the first insulating layer opposite a surface of the first insulating layer in which the first redistribution layer is embedded, and the first redistribution layer and the second redistribution layer are electrically connected to the connection pads of the semiconductor chip.

8. The semiconductor package of claim 7, wherein the first interconnection member further includes a second insulating layer disposed on the first insulating layer and covering the second redistribution layer and a third redistribution layer disposed on the second insulating layer, and the third redistribution layer is electrically connected to the connection pads of the semiconductor chip.

9. The semiconductor package of claim 7, wherein a distance between the redistribution layer of the second interconnection member and the first redistribution layer is greater than a distance between the redistribution layer of the second interconnection member and the connection pad of the semiconductor chip.

10. The semiconductor package of claim 7, wherein the first redistribution layer has a thickness greater than a thickness of the redistribution layer of the second interconnection member.

11. The semiconductor package of claim 7, wherein a lower surface of the first redistribution layer is disposed on above a lower surface of the connection pad.

12. The semiconductor package of claim 8, wherein the second redistribution layer is disposed between the active surface and the inactive surface of the semiconductor chip.

13. The semiconductor package of claim 1, further comprising a first interconnection member having a through-hole, in which the semiconductor chip is disposed, wherein the encapsulant encapsulates a portion of the first interconnection member and fills a portion of the through-hole to cover side surfaces of the semiconductor chip, the first interconnection member includes a first insulating layer, a first redistribution layer and a second redistribution layer disposed on opposite surfaces of the first insulating layer, a second insulating layer disposed on the first insulating layer and covering the first redistribution layer, and a third redistribution layer disposed on the second insulating layer, and the first to third redistribution layers are electrically connected to the connection pads of the semiconductor chip.

14. The semiconductor package of claim 13, wherein the first interconnection member further includes a third insulating layer disposed on the first insulating layer and at least partially covering the second redistribution layer and a fourth redistribution layer disposed on the third insulating layer, and the fourth redistribution layer is electrically connected to the connection pads of the semiconductor chip.

15. The semiconductor package of claim 13, wherein the first insulating layer has a thickness greater than a thickness of the second insulating layer.

16. The semiconductor package of claim 13, wherein the third redistribution layer has a thickness greater than a thickness of the redistribution layer of the second interconnection member.

17. The semiconductor package of claim 13, wherein the first redistribution layer is disposed between the active surface and the inactive surface of the semiconductor chip.

18. The semiconductor package of claim 13, wherein a lower surface of the third redistribution layer is disposed below a lower surface of the connection pad.

19. The semiconductor package of claim 1, wherein a lower surface of the encapsulant and a lowermost surface of the semiconductor chip that are in direct contact with the insulating layer of the second interconnection member are substantially coplanar with each other.

20. A semiconductor package comprising:

a semiconductor chip having an active surface including connection pads disposed thereon and an inactive surface opposite the active surface;

an encapsulant encapsulating at least some portions of the semiconductor chip and covering the inactive surface of the semiconductor chip; and an interconnection member including an insulating layer, on which the semiconductor chip and the encapsulant are disposed, and a redistribution layer electrically connected to the connection pads of the semiconductor chip, wherein the semiconductor chip has a groove in the active surface, the groove being disposed between a peripheral region of the semiconductor chip and a central region of the semiconductor chip on which the connection pads of the semiconductor chip are disposed, and the encapsulant includes a portion disposed between the peripheral region of the semiconductor chip and the insulating layer of the interconnection member.

* * * * *